United States Patent
Akram

[11] Patent Number: 5,869,787
[45] Date of Patent: Feb. 9, 1999

[54] ELECTRICALLY CONDUCTIVE PROJECTIONS

[75] Inventor: Salman Akram, Boise, Id.

[73] Assignee: Micron Technology, Inc., Boise, Id.

[21] Appl. No.: 846,683

[22] Filed: Apr. 30, 1997

Related U.S. Application Data

[63] Continuation of Ser. No. 621,188, Mar. 21, 1996, which is a continuation of Ser. No. 448,758, May 24, 1995, which is a division of Ser. No. 207,038, Mar. 7, 1994, Pat. No. 5,478,779.

[51] Int. Cl.⁶ ......................................................... H05K 1/00
[52] U.S. Cl. ............................................. 174/250; 438/14
[58] Field of Search .................................... 324/754, 755, 324/758; 174/261, 250, 255; 361/748, 760, 770, 767, 768; 439/55; 438/14, 17

[56] References Cited

U.S. PATENT DOCUMENTS

| | | | |
|---|---|---|---|
| 555,944 | 9/1896 | Farnworth et al. | 324/754 |
| 4,105,970 | 8/1978 | Katz | 324/158 P |
| 4,141,055 | 2/1979 | Berry et al. | 361/410 |
| 4,182,781 | 1/1980 | Hooper et al. | 427/90 |
| 4,189,825 | 2/1980 | Robillard et al. | 29/574 |
| 4,312,117 | 1/1982 | Robillard et al. | 29/589 |
| 4,417,206 | 11/1983 | Stowers | 324/158 P |
| 4,499,656 | 2/1985 | Fabian et al. | 29/576 E |
| 4,585,991 | 4/1986 | Reid et al. | 324/158 |
| 4,881,118 | 11/1989 | Niwayama et al. | 357/79 |
| 4,924,589 | 5/1990 | Leedy | 29/832 |
| 4,929,999 | 5/1990 | Hoeberechts et al. | 357/68 |
| 4,937,653 | 6/1990 | Blonder et al. | 357/68 |
| 4,952,272 | 8/1990 | Okino et al. | 156/630 |
| 4,963,225 | 10/1990 | Lehman-Lamar | 156/630 |
| 5,014,161 | 5/1991 | Lee et al. | 361/388 |
| 5,032,541 | 7/1991 | Sakamoto et al. | 437/203 |
| 5,045,780 | 9/1991 | Swart | 324/158 P |
| 5,072,116 | 12/1991 | Kawade et al. | 250/306 |
| 5,103,557 | 4/1992 | Leedy | 29/832 |
| 5,137,461 | 8/1992 | Bindra et al. | 439/74 |
| 5,177,438 | 1/1993 | Littlebury et al. | 324/158 |
| 5,177,439 | 1/1993 | Liu et al. | 324/158 |
| 5,206,858 | 4/1993 | Chang et al. | 324/158 P |
| 5,239,260 | 8/1993 | Widder et al. | 324/754 |

(List continued on next page.)

FOREIGN PATENT DOCUMENTS

| | | |
|---|---|---|
| 329314 | 8/1989 | European Pat. Off. . |
| 57143838 | 9/1982 | Japan . |
| 2-5540 | 1/1990 | Japan . |
| 2232946 | 9/1990 | Japan . |
| 53171 | 3/1991 | Japan . |
| 108350 | 5/1991 | Japan . |
| 410446 | 1/1992 | Japan . |

OTHER PUBLICATIONS

Moto's Nakano, "A Probe for Testing Semiconductor Integrated Circuits and a Test Method Using said Probe," Mar. 25, 1991, Japanese Patent Office Disclosure No. Hei 3–69131, filing No. 1–0205301, filing date Aug. 8, 1989.

*Primary Examiner*—Bot L. Ledynh
*Assistant Examiner*—Kristina Soderguist
*Attorney, Agent, or Firm*—Wells, St. John, Roberts, Gregory & Matkin, P.S.

[57] ABSTRACT

An electrically conductive apparatus includes, a) an electrically non-conducting substrate, the substrate having a base surface and an adjacent elevated surface, the elevated surface being spaced from the base surface by a first distance thereby defining a step having a step wall; b) a capping layer of first electrically conductive material coating the elevated surface only portions of the step wall, the capping layer having outer top and outer side portions; and c) a conductive trace of second electrically conductive material which is different from the first electrically conductive material; the conductive trace overlying the substrate, portions of the step wall not covered by the capping layer, and the outer side portions of the capping layer. Methods are disclosed for producing such a construction, for forming an electrically conductive projection outwardly extending from a substrate, and for providing an electrical interconnection between adjacent different elevation areas on a substrate.

31 Claims, 9 Drawing Sheets

U.S. PATENT DOCUMENTS

| | | | |
|---|---|---|---|
| 5,245,135 | 9/1993 | Schreiber et al. | 174/261 |
| 5,262,718 | 11/1993 | Svendsen et al. | 324/158 |
| 5,307,561 | 5/1994 | Feigenbaum et al. | 29/846 |
| 5,323,035 | 6/1994 | Leedy | 257/248 |
| 5,326,428 | 7/1994 | Farnworth et al. | 156/654 |
| 5,353,195 | 10/1994 | Fillion et al. | 361/760 |
| 5,402,077 | 3/1995 | Agahdel et al. | 324/758 |
| 5,419,807 | 5/1995 | Akram et al. | 156/647 |
| 5,468,917 | 11/1995 | Brodsky et al. | 174/255 |
| 5,625,297 | 4/1997 | Arnaudov et al. | 324/754 |
| 5,716,218 | 2/1998 | Farnworth et al. | 438/15 |

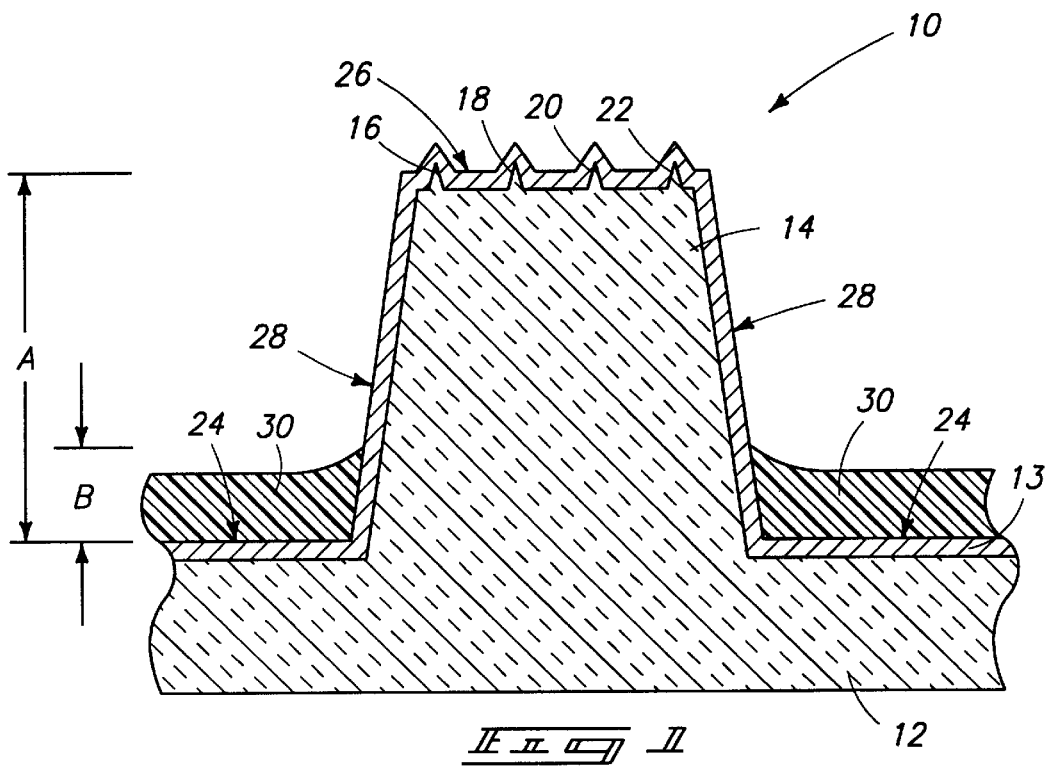
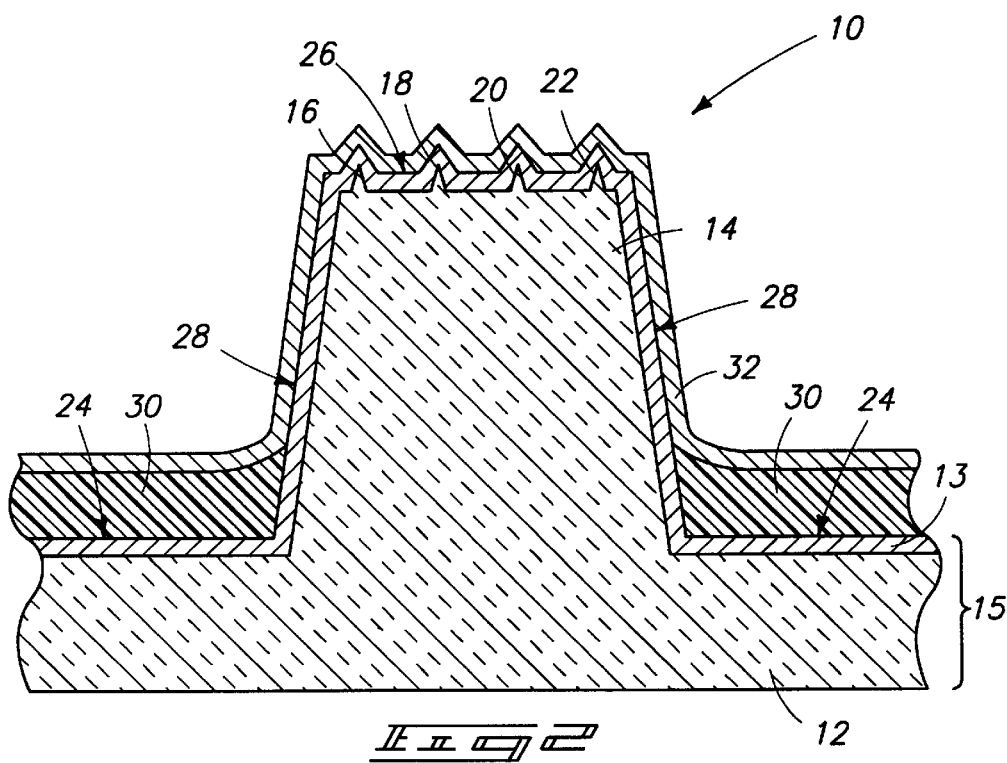

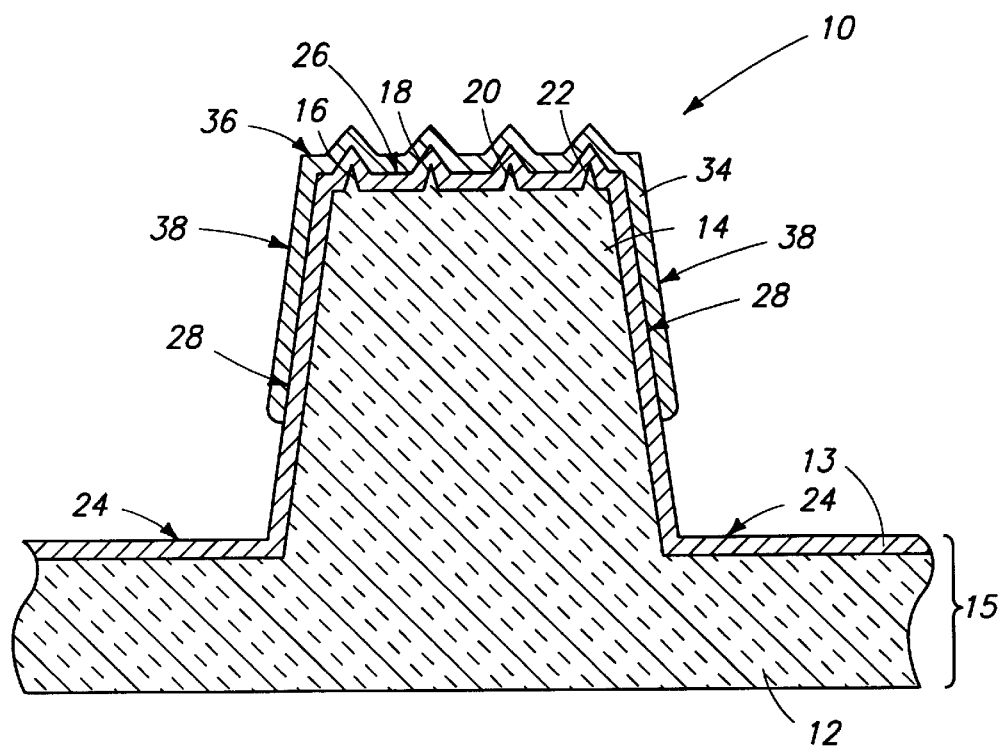
_Fig. 3_
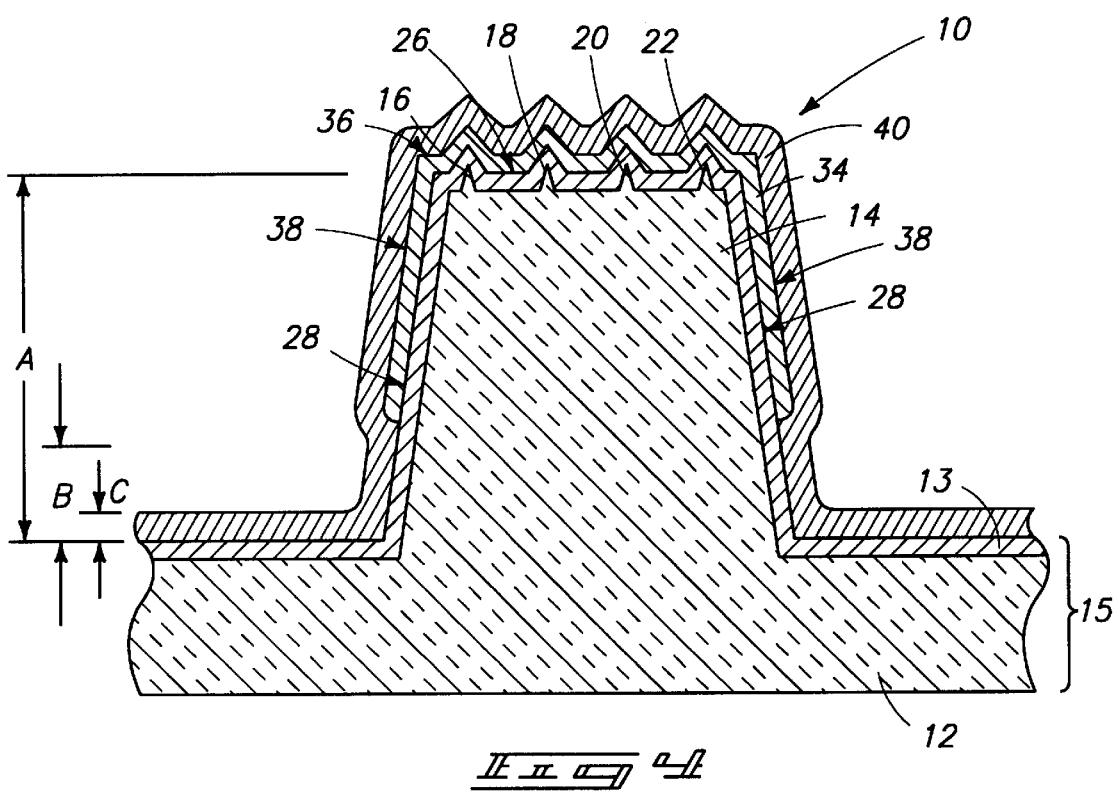
_Fig. 4_

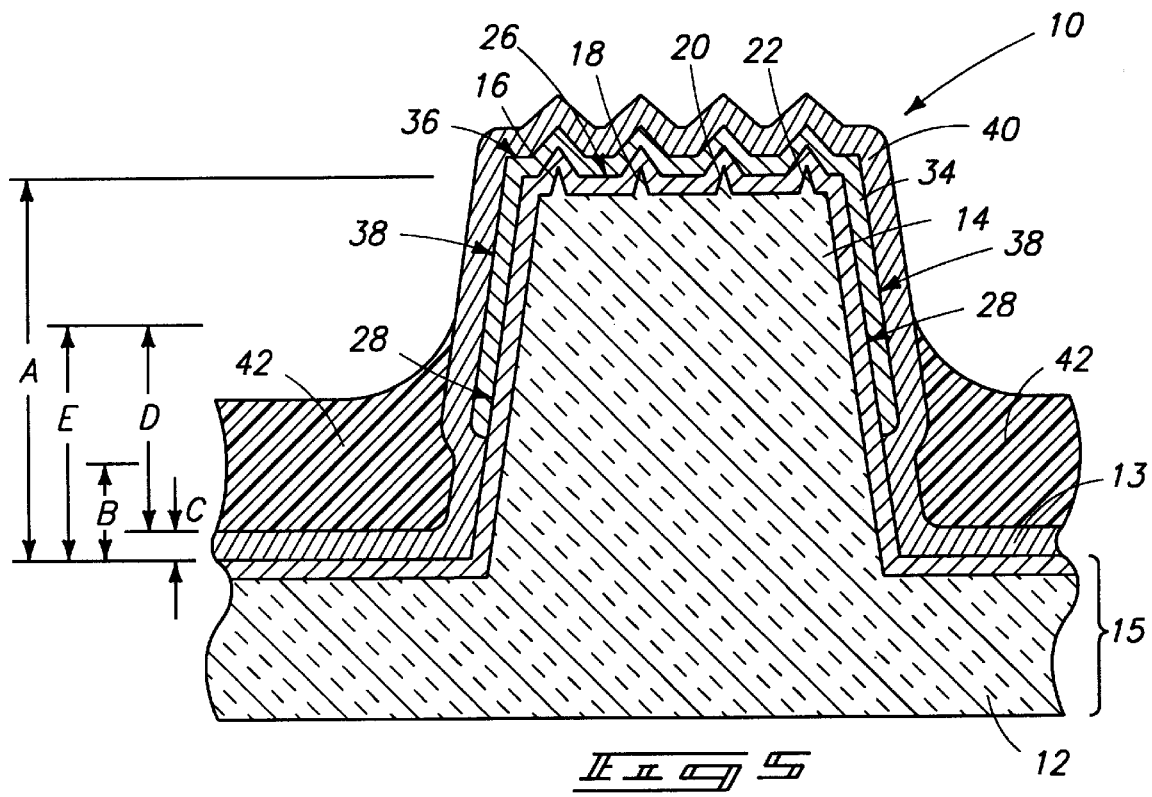
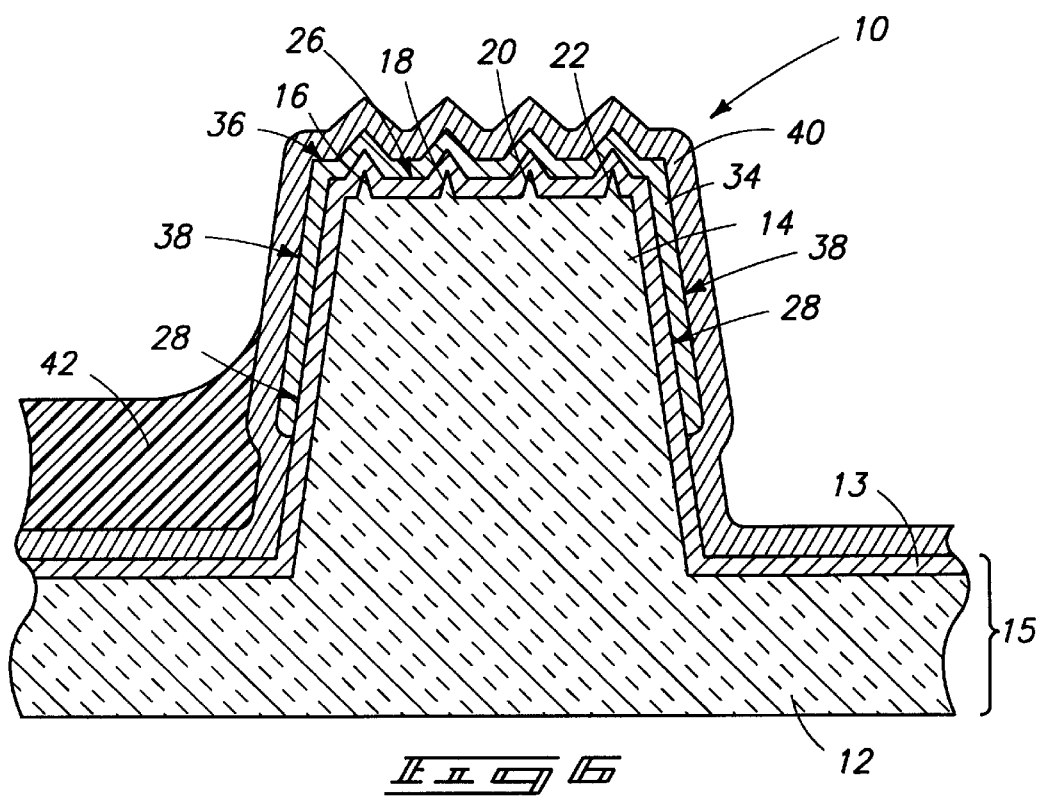

5,869,787

ELECTRICALLY CONDUCTIVE PROJECTIONS

RELATED PATENT DATA

This patent resulted from a file wrapper continuation application under 37 CFR §1.62 of prior U.S. patent application Ser. No. 08/621,188, filed on Mar. 21, 1996, entitled "Electrically Conductive Projections", listing the inventor as Salman Akram, which resulted from a file wrapper continuation application of Ser. No. 08/448,758, filed on May 24, 1995, which resulted from a divisional application of Ser. No. 08/207,038, filed on Mar. 7, 1994, and which is now U.S. Pat. No. 5,478,779.

TECHNICAL FIELD

This invention relates to semiconductor processing methods of forming an electrically conductive projection outwardly extending from a substrate, to semiconductor processing methods of providing an electrical interconnection between adjacent different elevation areas on a substrate, and to electrically conductive apparatus. This invention also relates to methods for testing semiconductor circuitry for operability, and to constructions and methods of testing apparatus for operability of semiconductor circuitry.

BACKGROUND OF THE INVENTION

This invention relates to subject matter of our U.S. patent application Ser. No. 08/116,394, filed on Sep. 3, 1993, and entitled "Method and Apparatus for Testing Semiconductor Circuitry for Operability and Method of Forming Apparatus for Testing Semiconductor Circuitry for Operability", which is now U.S. Pat. No. 5,326,428. This '394 application and patent is hereby fully incorporated into this document by reference.

Aspects of the related disclosure grew out of the needs and problems associated with multichip modules. Considerable advancement has occurred in the last fifty years in electronic development and packaging. Integrated circuit density has and continues to increase at a significant rate. However by the 1980's, the increase in density in integrated circuitry was not being matched with a corresponding increase in density of the interconnecting circuitry external of circuitry formed within a chip. Many new packaging technologies have emerged, including that of "multichip module" technology.

In many cases, multichip modules can be fabricated faster and more cheaply than by designing new substrate integrated circuitry. Multichip module technology is advantageous because of the density increase. With increased density comes equivalent improvements in signal propagation speed and overall device weight unmatched by other means. Current multichip module construction typically consists of a printed circuit board substrate to which a series of integrated circuit components are directly adhered.

Many semiconductor chip fabrication methods package individual dies in a protecting, encapsulating material. Electrical connections are made by wire bond or tape to external pin leads adapted for plugging into sockets on a circuit board. However, with multichip module constructions, non-encapsulated chips or dies are secured to a substrate, typically using adhesive, and have outwardly exposed bonding pads. Wire or other bonding is then made between the bonding pads on the unpackaged chips and electrical leads on the substrate.

Much of the integrity/reliability testing of multichip module dies is not conducted until the chip is substantially complete in its construction. Considerable reliability testing must be conducted prior to shipment. In one aspect, existing technology provides temporary wire bonds to the wire pads on the die for performing the various required tests. However this is a low-volume operation, and further requires the test bond wire to ultimately be removed. This can lead to irreparable damage, thus effectively destroying the chip.

Another prior art test technique uses a series of pointed probes which are aligned to physically engage the various bonding pads on a chip. One probe is provided for engaging each bonding pad for providing a desired electrical connection. One drawback with such testing is that the pins undesirably on occasion penetrate completely through the bonding pads, or scratch the bonding pads possibly leading to chip ruin.

The invention described below was motivated in the desire to develop improved electrical interconnection techniques associated with the invention of the related '394 application. It is, however, recognized that the invention disclosed herein is further applicable to methods and constructions beyond that disclosed in the related '394 disclosure. This invention, therefore, is limited only by the accompanying claims appropriately interpreted in accordance with the Doctrine of Equivalents.

BRIEF DESCRIPTION OF THE DRAWINGS

Preferred embodiments of the invention are described below with reference to the following accompanying drawings.

FIG. 1 is a diagrammatic representation of a fragment of a substrate processed in accordance with the invention.

FIG. 2 is a view of the FIG. 1 substrate fragment at a processing step subsequent to that shown by FIG. 1.

FIG. 3 is a view of the FIG. 1 substrate fragment at a processing step subsequent to that shown by FIG. 2.

FIG. 4 is a view of the FIG. 1 substrate fragment at a processing step subsequent to that shown by FIG. 3.

FIG. 5 is a view of the FIG. 1 substrate fragment at a processing step subsequent to that shown by FIG. 4.

FIG. 6 is a view of the FIG. 1 substrate fragment at a processing step subsequent to that shown by FIG. 5.

DETAILED DESCRIPTION OF THE PREFERRED EMBODIMENTS

Figure 7:
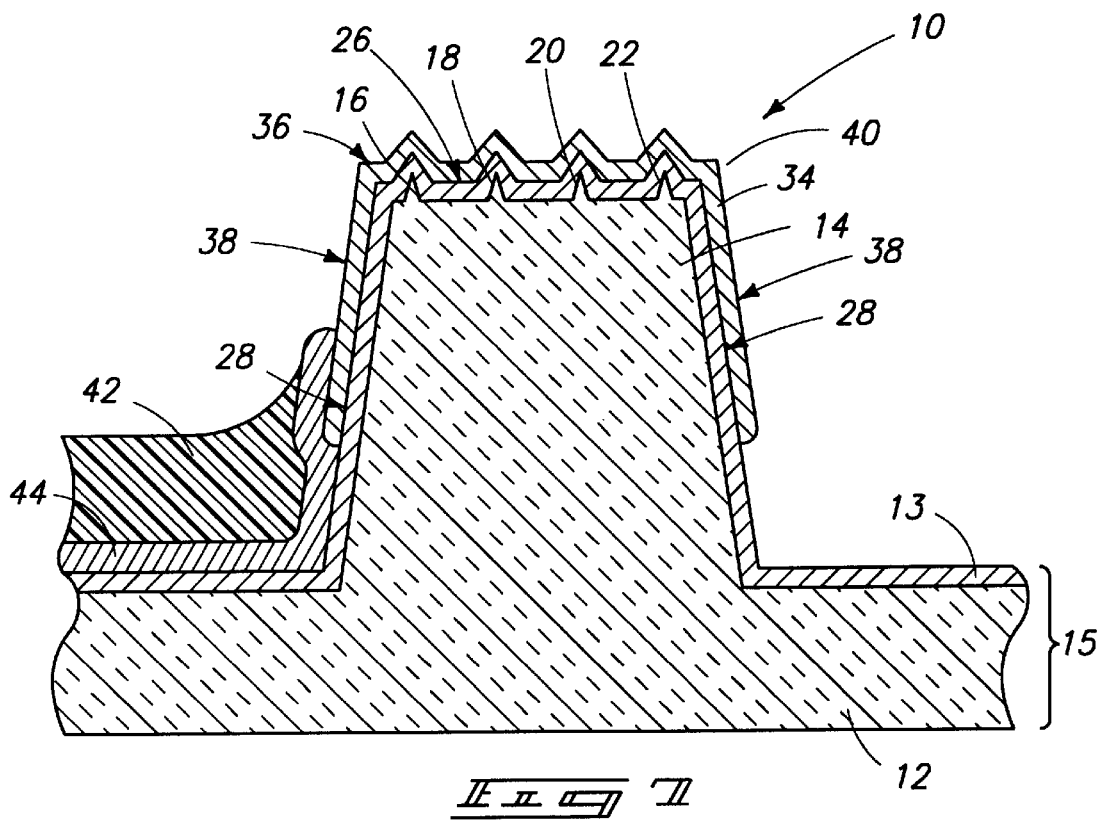
FIG. 7 is a view of the FIG. 1 substrate fragment at a processing step subsequent to that shown by FIG. 6.
Figure 8:
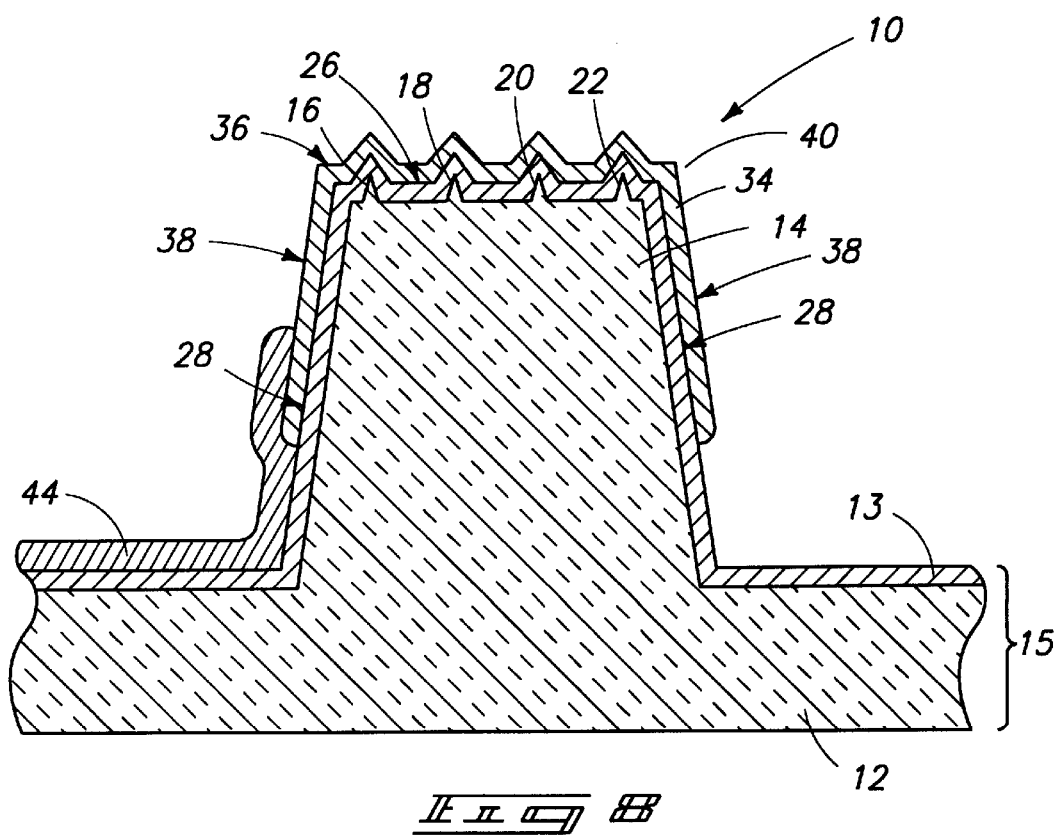
FIG. 8 is a view of the FIG. 1 substrate fragment at a processing step subsequent to that shown by FIG. 7.
Figure 9:
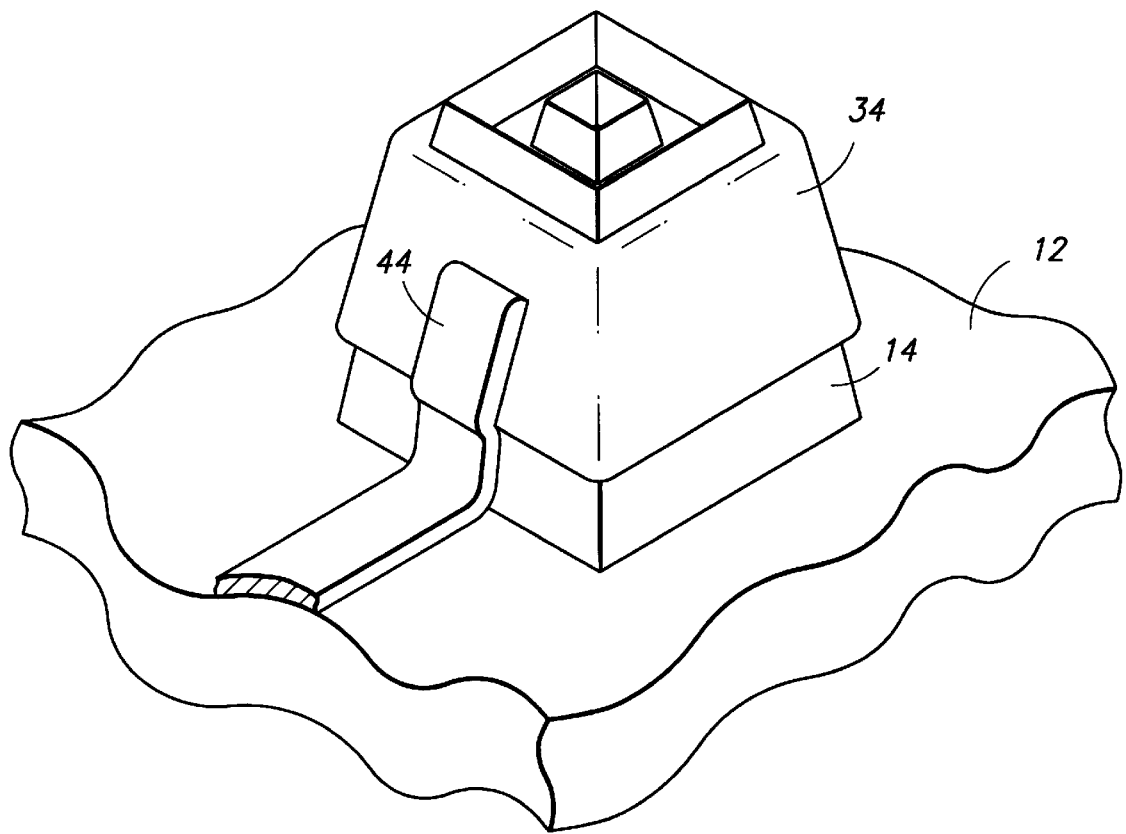
FIG. 9 is a perspective view of the FIG. 8 substrate fragment.

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of forming an electrically conductive projection outwardly extending from a substrate comprises the following steps:

providing a substrate having a projecting pillar, the substrate having an outer surface, the pillar projecting outwardly from the substrate outer surface to a first distance;

providing a base layer of photoresist over the substrate outer surface to a first maximum thickness which is less than the first distance to provide the pillar projecting outwardly of the base photoresist layer;

providing a base layer of electrically conductive material over the pillar and base layer of photoresist;

lifting off the base photoresist layer and overlying base layer of electrically conductive material thereby providing the pillar with an electrically isolated cap of base layer electrically conductive material, the cap having top and side portions;

providing an interconnecting layer of electrically conductive material over the substrate and pillar cap to a second maximum thickness, the interconnecting electrically conductive material being selectively etchable relative to the base electrically conductive material;

providing a masking layer of photoresist over the interconnecting layer to a third maximum thickness, the second thickness and third thickness having a sum which is greater than the first thickness;

patterning the photoresist masking layer for formation of an interconnecting material conductive line extending from the pillar cap; and after patterning, etching exposed interconnecting material from the cap and substrate to define a conductive line electrically engaging the side portion of the conductive cap.

In accordance with another aspect of the invention, an electrically conductive apparatus comprises:

an electrically non-conducting substrate;

a pillar outwardly projecting from the substrate, the pillar having a top surface and having side surfaces extending to the substrate;

a cap of first electrically conductive material coating the pillar outermost top surface and only portions of the pillar side surfaces outwardly of the substrate, the cap having outer top and outer side portions; and a conductive trace of second electrically conductive material which is different from the first electrically conductive material; the conductive trace overlying the substrate, portions of the pillar side surfaces not covered by the cap, and the outer side portions of the cap.

In accordance with still a further aspect of the invention, a semiconductor processing method of providing an electrical interconnection between adjacent different elevation areas on a substrate, the method comprising the following steps:

providing a substrate having a base surface and an adjacent elevated surface, the elevated surface being spaced from the base surface by a first distance thereby defining a step having a step wall;

providing a base layer of photoresist over the substrate base surface to a first maximum thickness which is less than the first distance and providing the elevated surface free of base photoresist;

providing a base layer of electrically conductive material over the elevated surface, step wall and base layer of photoresist;

lifting off the base photoresist layer and overlying base layer of electrically conductive material thereby providing the elevated surface with a capping layer of base electrically conductive material which is electrically isolated from the adjacent substrate base surface, the capping layer having a side portion and a top portion, the side portion extending downwardly along the step wall from the top portion and elevated surface toward but not to the substrate base surface;

providing an interconnecting layer of electrically conductive material over the substrate and capping layer to a second maximum thickness, the interconnecting electrically conductive material being selectively etchable relative to the base electrically conductive material;

providing a masking layer of photoresist over the interconnecting layer to a third maximum thickness, the second thickness and third thickness having a sum which is greater than the first thickness;

patterning the photoresist masking layer for formation of an interconnecting material conductive line extending from the capping layer; and after patterning, etching exposed interconnecting material from the capping layer and substrate to define a conductive line electrically engaging the side portion of the capping layer.

More specifically and first with reference to FIGS. 1–9, a semiconductor wafer fragment is indicated generally by reference numeral 10. Such is comprised of a bulk substrate 12, preferably composed of monocrystalline silicon, and an overlying layer 13 of an insulating material. Layer 13 preferably comprises an oxide or nitride, such as silicon dioxide or silicon nitride, with 2000 Angstroms being an example thickness. In combination, bulk substrate 12 and insulating layer 13 define an electrically non-conducting substrate 15. A pillar 14 projects from substrate 15. Pillar 14 can comprise the same material of substrate 15. Accordingly, such can be formed from bulk substrate 12 in a manner described in the related Ser. No. '394 disclosure. A series of apexes 16, 18, 20 and 22 are provided atop pillar 14 in a manner and for reasons also disclosed in the related '394 closure. Thereafter, layer 13 would be deposited. Substrate 15 has an outer surface 24, and pillar 14 has a general outer surface 26. Accordingly, pillar 14 projects outwardly from substrate outer surface 24 to a first distance designated as "A". For purposes of the continuing discussion, pillar 14 also includes side surfaces 28 extending between top surface 26 and substrate outer surface 24.

A base layer 30 of photoresist is provided over substrate outer surface 24 to a first maximum thickness "B", which is less than first distance "A". The preferred photoresist is one of low viscosity, such as somewhere between 20 cp and 50 cp, and is typically spun onto the wafer. Such will provide pillar 14 projecting outwardly of base photoresist layer 30. It is desirable that no photoresist remain on any of the pillar side or top surfaces. An optional exposure of the pillar using the same mask utilized to produce pillar 14 from substrate 12 could be utilized to remove any undesired photoresist adhering to pillar 14 above the plane of layer 30. By way of example only, an example dimension "A" would be 75 microns, while an example dimension "B" would be 2 to 3 microns.

Referring to FIG. 2, a base layer 32 of electrically conductive material is provided over pillar 14 and base photoresist layer 30. Such preferably comprises metal, with elemental platinum being but one preferred example. An example thickness for layer 32 would be 500 Angstroms to 2000 Angstroms.

Referring to FIG. 3, a conventional photoresist lift-off technique is employed to remove base photoresist layer 30 and overlying conductive base layer 32. Such provides pillar 14 with an electrically isolated cap 34 of base layer electrically conductive material. In the illustrated preferred embodiment, cap 34 completely coats pillar outermost top surface 26 and only portions of pillar side surfaces 28 outwardly of substrate 12. For purposes of the continuing discussion, cap 34 itself includes an outer top portion 36 and side portions 38. One example lift-off solution usable to produce the construction of FIG. 3 from that of FIG. 2 is ST22 photoresist stripper solution available from Advanced Chemical Systems International of Milipitas, Calif.

Where material of cap 34 comprises metal and material of pillar 14 comprises silicon, it might be desirable to conduct a conventional high temperature anneal step to cause a reaction between the materials of cap 34 and pillar 14 at the interface of the cap and pillar. Such might be desirable to promote adhesion of cap 34 relative to pillar 14.

Referring to FIG. 4, an interconnecting layer 40 of electrically conductive material is provided over the underlying substrate and pillar cap 34 to a second thickness "C". Material of layer 40 is selected to be selectively etchable relative to material of cap 34. Preferably, layer 40 is composed of metal, with a preferred example being aluminum.

Referring to FIG. 5, a masking layer 42 of photoresist is provided over interconnecting layer 40 to a third maximum thickness "D". Second photoresist layer 42 is preferably comprised of a higher viscosity photoresist than the first photoresist layer 30 to maximize the elevational encroachment relative to pillar 14, as shown. To enhance this encroachment, the photoresist is spun on at low speeds after which the wafer is vibrated to enhance the photoresist to flow down from the tip towards the base. An example preferred viscosity range for this higher viscosity photoresist layer 42 is 100 to 300 cp. In the reduction-to-practice method, the photoresist of layer 30 had a viscosity of 30 cp, while the photoresist used for layer 42 had a viscosity of 130 cp. The relative thicknesses are chosen such that second thickness "C" and third thickness "D" have a sum thickness "E" which is greater than first thickness "B" of first photoresist layer 30.

Referring to FIG. 6, photoresist layer 42 is patterned for formation of an interconnecting material conductive line which will extend from pillar cap 34, as shown. After such patterning and referring to FIG. 7, exposed interconnecting material overlying cap 34 and the underlying substrate are etched selectively relative thereto, which defines a conductive line or trace 44 which electrically engages a side portion 38 of conductive cap 34. In the preferred embodiment as shown, conductive trace 44 overlies bulk substrate 12, portions of pillar side surfaces 28 not covered by cap 34, and outer side portions 38 of cap 34, but not on top portion 36 of cap 34. Photoresist 42 is subsequently removed to produce the construction illustrated by FIGS. 8 and 9.

Third thickness "D" is also preferably less than first distance "A" of pillar 14 at its point of deposition. Alternately, but less preferred, an extremely thick layer of photoresist (e.g., of a thickness "A") might be provided and subsequently etched back (e.g., to a thickness "D").

The above described use of an insulating oxide or nitride layer 13 atop bulk substrate 12 provides an effective insulating isolation between the electrically conductive tips and their interconnects regardless of the conductive nature of bulk substrate 12. For example, monocrystalline silicon is insulative below 100° C. and becomes conductive above 100° C. Accordingly where the construction is used above 100° C., a projection whose underlying substrate is entirely formed of silicon loses its electrical isolation. Coating the projection with an insulating layer as described above eliminates this potential problem.

Figure 10:
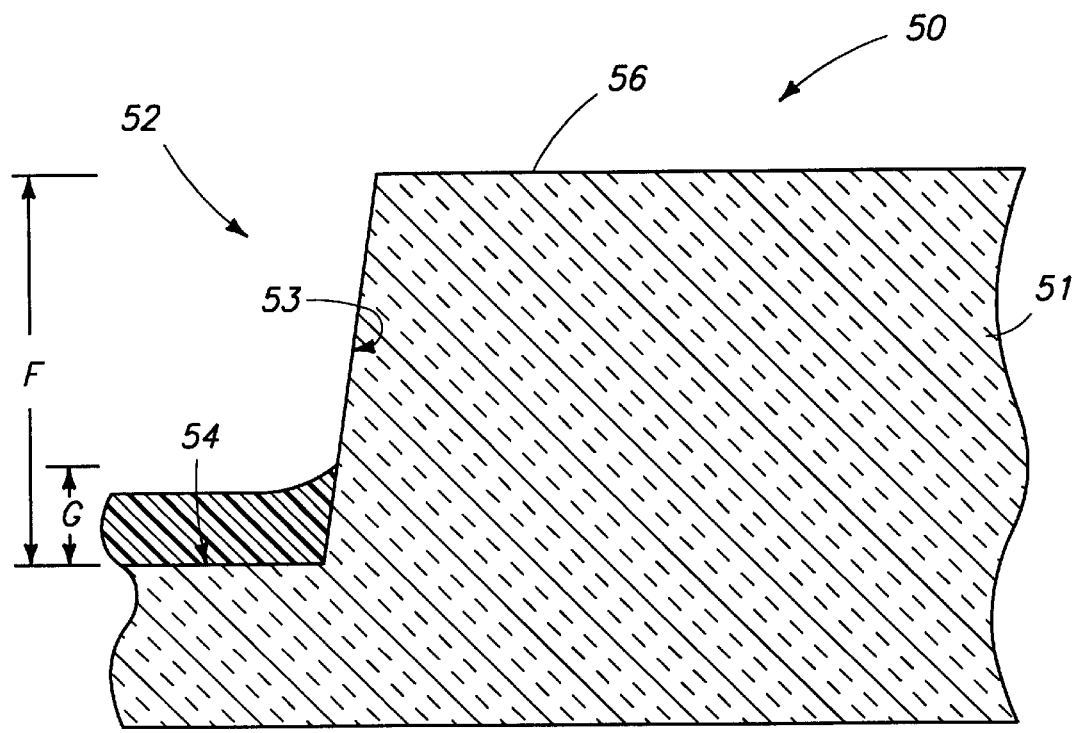
FIG. 10 is a diagrammatic representation of an alternate fragment of a substrate processed in accordance with the invention.

Aspects of the invention are also believed applicable in providing electrical interconnection over a step in semiconductor processing regardless of the presence of a pillar. This is described with reference to FIGS. 10–16. Referring first to FIG. 10, a wafer fragment processed in accordance with this aspect of the invention is indicated generally by reference numeral 50. Such includes a substrate 51, a step 52 defining a base substrate surface 54 and an adjacent elevated surface 56, and a step wall 53. Elevated surface 56 is spaced from base surface 54 by a first distance "F". A base layer 58 of photoresist of the same preferred properties of the photoresist of layer 30 in the first described embodiment is provided over substrate base surface 54 to a first thickness "G", with "G" being less than "F". Such preferably leaves elevated surface 56 free of photoresist.

Figure 11:
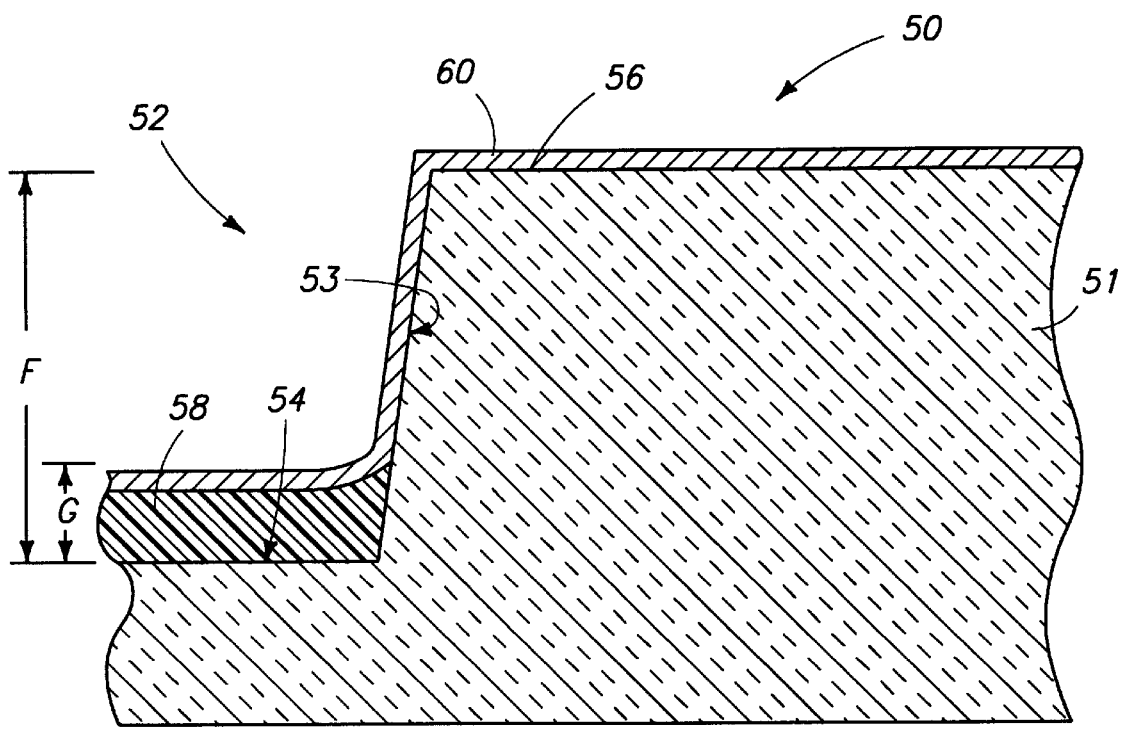
FIG. 11 is a view of the FIG. 10 substrate fragment at a processing step subsequent to that shown by FIG. 10.

Refereeing to FIG. 11, a base layer 60 of electrically conductive material is provided over elevated surface 56, step wall 53 and base photoresist layer 58. Layer 60 preferably comprises metal.

Figure 12:
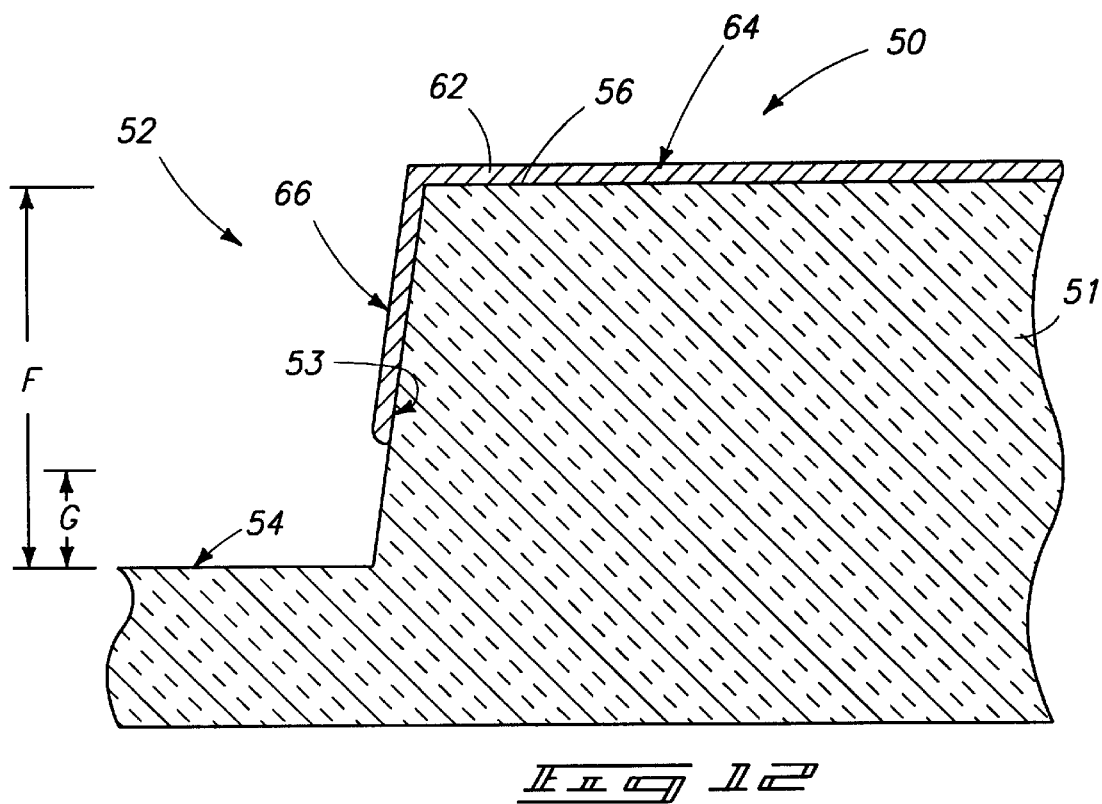
FIG. 12 is a view of the FIG. 10 substrate fragment at a processing step subsequent to that shown by FIG. 11.

Referring to FIG. 12, base photoresist layer 58 is removed by a conventional lift-off technique which also removes portions of conductive layer 60 overlying photoresist layer 58. The resulting process leaves elevated surface 56 covered with a capping layer 62 of base electrically conductive material which is electrically isolated from adjacent substrate base surface 54. Cap 62 has a top portion 64 and a side portion 66, with side portion 66 extending downwardly along step wall 53 toward but not to substrate base surface 54.

Figure 13:
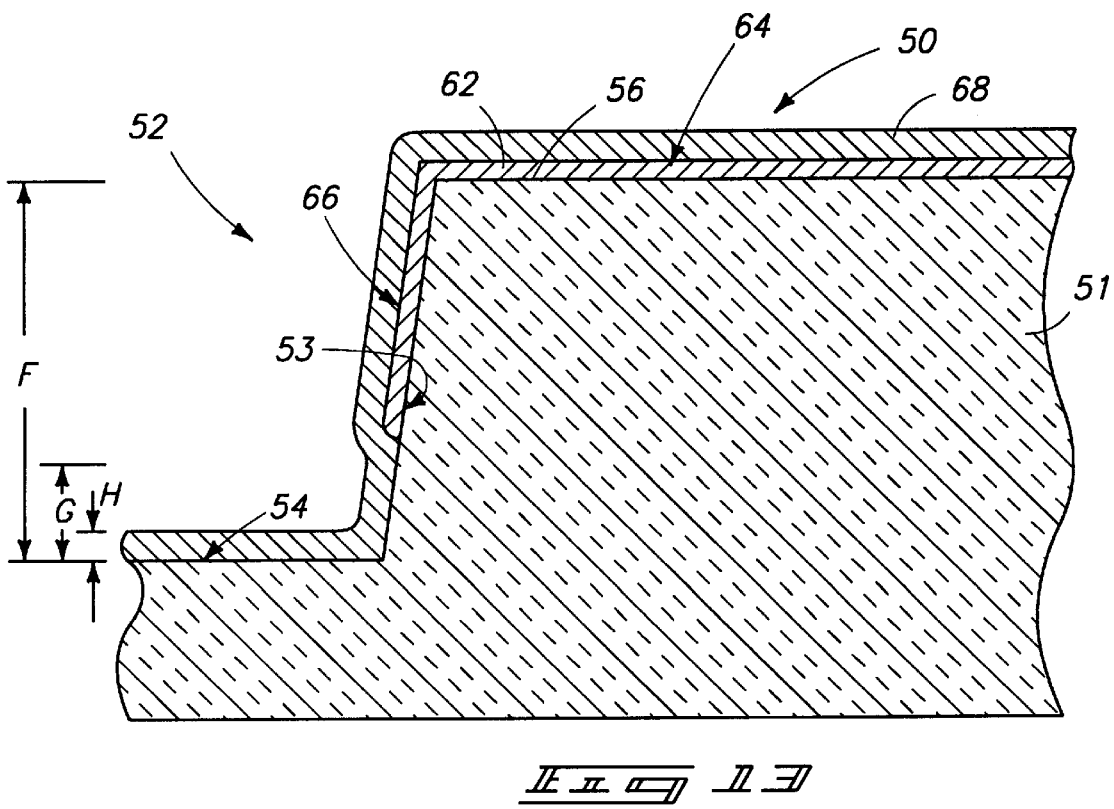
FIG. 13 is a view of the FIG. 10 substrate fragment at a processing step subsequent to that shown by FIG. 12.

Referring to FIG. 13, an interconnecting layer 68 of electrically conductive material is provided over the underlying substrate and capping layer 62 to a second maximum thickness "H". Material of layer 68 preferably comprises metal, and is chosen to be selectively etchable relative to conductive material of base electrically conductive cap 62.

Figure 14:
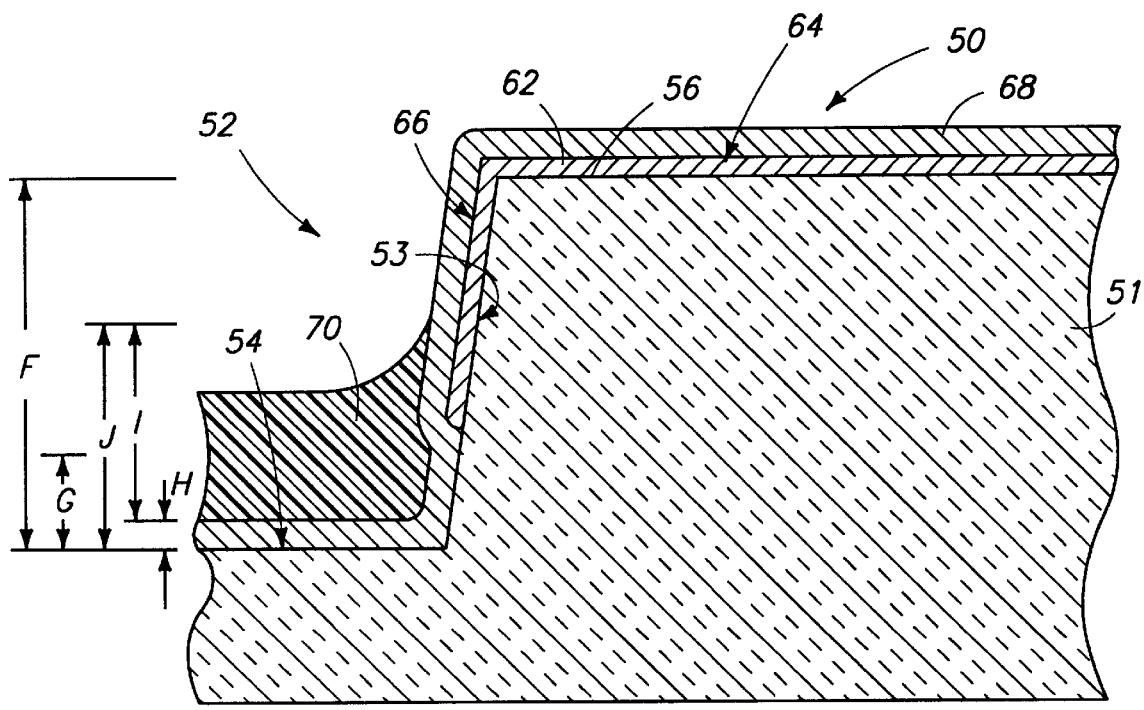
FIG. 14 is a view of the FIG. 10 substrate fragment at a processing step subsequent to that shown by FIG. 13.
Figure 15:
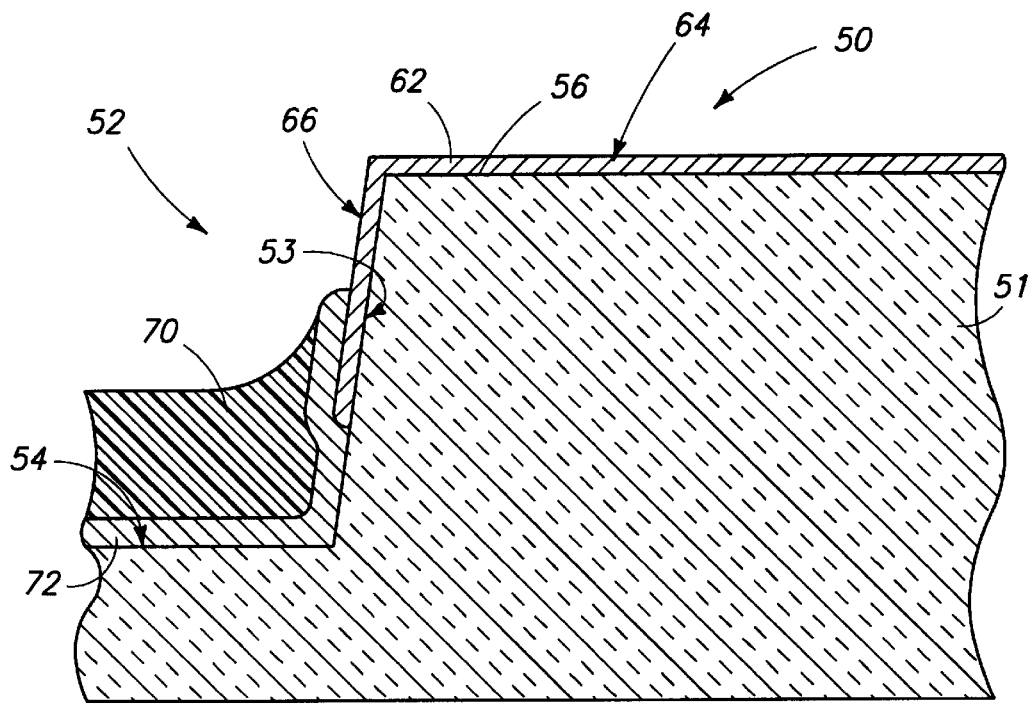
FIG. 15 is a view of the FIG. 10 substrate fragment at a processing step subsequent to that shown by FIG. 14.
Figure 16:
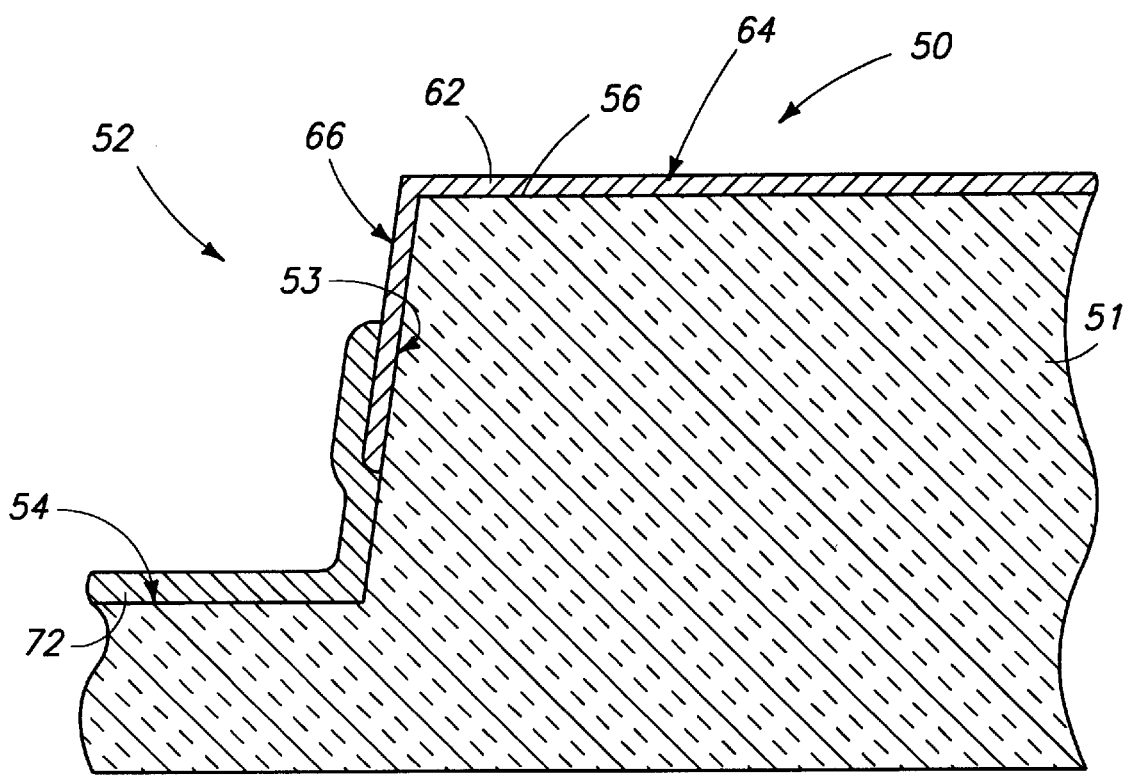
FIG. 16 is a view of the FIG. 10 substrate fragment at a processing step subsequent to that shown by FIG. 15.

Referring to FIG. 14, a masking layer 70 of photoresist is provided over interconnecting layer 68 to a third maximum thickness "I". Second thickness "H" and third thickness "I" have a sum thickness "J" which is greater than first thickness "G". Again, the photoresist of layer 70 is preferably of a higher viscosity than the photoresist of layer 58. Photoresist layer 70 would then be patterned for formation of an interconnecting material conductive line which extends from side portions of capping layer 62. After such patterning, exposed interconnecting material from layer 68 would be etched from capping layer 62 and underlying substrate, as shown in FIG. 15, to define a conductive line 72 which electrically engages side portion 66 of capping layer 62. Photoresist would subsequently be removed, as shown in FIG. 16.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

It is claimed:

1. An electrically conductive apparatus comprising:
   an electrically non-conducting substrate;
   a pillar outwardly projecting from the substrate, the pillar having a top surface and having side surfaces extending to the substrate;
   a cap of first electrically conductive material coating the pillar outermost top surface and only portions of the pillar side surfaces outwardly of the substrate, the cap having outer top and outer side portions; and
   a conductive trace of second electrically conductive material which is different from the first electrically conductive material; the conductive trace overlying the substrate, portions of the pillar side surfaces not covered by the cap, and the outer side portions of the cap.

2. The electrically conductive apparatus of claim 1 wherein the substrate comprises silicon.

3. The electrically conductive apparatus of claim 1 wherein the substrate comprises a silicon bulk substrate having a coating layer of an insulating material.

4. The electrically conductive apparatus of claim 1 wherein the pillar constitutes the same material as the substrate.

5. The electrically conductive apparatus of claim 1 wherein the substrate and pillar comprise silicon having a coating layer of an insulating material.

6. The electrically conductive apparatus of claim 1 wherein the substrate and pillar comprise silicon having a coating layer of an insulating material, and the cap and conductive trace comprise metals.

7. The electrically conductive apparatus of claim 1 wherein the conductive trace does not overlie the cap top portion.

8. The electrically conductive apparatus of claim 7 wherein the substrate comprises silicon.

9. The electrically conductive apparatus of claim 7 wherein the substrate comprises a silicon bulk substrate having a coating layer of an insulating material.

10. The electrically conductive apparatus of claim 7 wherein the pillar constitutes the same material as the substrate.

11. The electrically conductive apparatus of claim 7 wherein the substrate and pillar comprise silicon having a coating layer of an insulating material.

12. The electrically conductive apparatus of claim 7 wherein the substrate and pillar comprise silicon having a coating layer of an insulating material, and the cap and conductive trace comprise metals.

13. An electrically conductive apparatus comprising:
    an electrically non-conducting substrate, the substrate having a base surface and an adjacent elevated surface, the elevated surface being spaced from the base surface by a first distance thereby defining a step having a step wall;
    a capping layer of first electrically conductive material coating the elevated surface and only portions of the step wall, the capping layer having outer top and outer side portions; and
    a conductive trace of second electrically conductive material which is different from the first electrically conductive material; the conductive trace overlying the substrate, portions of the step wall not covered by the capping layer, and the outer side portions of the capping layer.

14. The electrically conductive apparatus of claim 13 wherein the conductive trace does not overlie the capping layer top portion.

15. The electrically conductive apparatus of claim 13 wherein the electrically non-conducting substrate comprises a silicon bulk substrate having a coating layer of an insulating material.

16. An assembly formed on a semiconductor substrate, comprising:
    a pillar generally projecting away from the substrate, the pillar having a top surface and having at least one side surface extending to the substrate;
    a layer of a first electrically conductive material over the top surface, the first conductive material layer over the top surface not extending to the substrate proximate the pillar; and
    a conductive member formed of a second electrically conductive material electrically coupling the first conductive material to a second location, the second electrically conductive material physically contacting the first electrically conductive material, and wherein the conductive member does not overlie the pillar top surface.

17. An assembly formed on a semi-conductor substrate, comprising:
    a pillar generally projecting away from the substrate, the pillar having a top surface and having at least one side surface extending to the substrate, the pillar comprising a semiconductive material coated with an insulating dielectric material;
    a layer of a first electrically conductive material over the top surface, the first conductive material layer over the top surface not extending to the substrate proximate the pillar; and
    a conductive member formed of a second electrically conductive material electrically coupling the first conductive material to a second location, wherein the conductive member does not overlie the pillar top surface.

18. An assembly formed on a semi-conductor substrate, comprising:
    a pillar generally projecting away from the substrate, the pillar having a top surface and having at least one side surface extending to the substrate;
    a layer of a first electrically conductive material over the top surface, the first conductive material layer over the top surface not extending to the substrate proximate the pillar; and
    a conductive member formed of a second electrically conductive material electrically coupling the first conductive material to a second location, wherein the conductive member does not overlie the pillar top surface, the second conductive material being different from the first conductive material.

19. An assembly formed on a semi-conductor substrate, comprising:
    a pillar generally projecting away from the substrate, the pillar having a top surface and having at least one side surface extending to the substrate;
    a layer of a first electrically conductive material over the top surface, the first conductive material layer over the top surface not extending to the substrate proximate the pillar;
    a conductive member formed of a second electrically conductive material electrically coupling the first conductive material to a second location, wherein the conductive member does not overlie the pillar top surface; and wherein the pillar comprises semiconductive material coated with an insulating dielectric material, and the second conductive material is different from the first conductive material.

20. An assembly formed on a semiconductor substrate, comprising:

a pillar generally projecting away from the substrate, the pillar having an outer surface, the outer surface having a first portion proximate the substrate and a second portion relatively removed from the substrate;

a layer of a first conductive material over the second portion of the pillar but not over the first portion of the pillar; and an electrical interconnect of a second conductive material provided between the first conductive material layer and a second location, the second conductive material physically contacting the first conductive material and wherein the electrical interconnect does not overlie the pillar top surface.

21. An assembly formed on a semi-conductor substrate, comprising:

a pillar generally projecting away from the substrate, the pillar having an outer surface, the outer surface having a first portion proximate the substrate and a second portion relatively removed from the substrate, the pillar comprising a semiconductive material coated with an insulating dielectric material;

a layer of a first conductive material over the second portion of the pillar but not over the first portion of the pillar; and an electrical interconnect of a second conductive material provided between the first conductive material layer and a second location wherein the electrical interconnect does not overlie the pillar top surface.

22. An assembly formed on a semi-conductor substrate, comprising:

a pillar generally projecting away from the substrate, the pillar having an outer surface, the outer surface having a first portion proximate the substrate and a second portion relatively removed from the substrate;

a layer of a first conductive material over the second portion of the pillar but not over the first portion of the pillar; and an electrical interconnect of a second conductive material provided between the first conductive material layer and a second location, wherein the electrical interconnect does not overlie the pillar top surface, the second conductive material being different from the first conductive material.

23. An assembly formed on a semi-conductor substrate, comprising:

a pillar generally projecting away from the substrate, the pillar having an outer surface, the outer surface having a first portion proximate the substrate and a second portion relatively removed from the substrate;

a layer of a first conductive material over the second portion of the pillar but not over the first portion of the pillar; and an electrical interconnect of a second conductive material provided between the first conductive material layer and a second location, wherein the electrical interconnect does not overlie the pillar top surface; and wherein the pillar comprises semiconductive material coated with an insulating dielectric material, and the second conductive material is different from the first conductive material.

24. An assembly formed on a semiconductor substrate, comprising:

a base surface over the substrate and an adjacent elevated surface over the substrate, the elevated surface being spaced from the base surface by a first distance thereby defining a step having a step wall;

a layer of a first electrically conductive material over the elevated surface, the first conductive material layer being over the elevated surface and a portion of the step wall and not extending to the base surface proximate the step wall;

a conductive member formed of a second electrically conductive material electrically coupling the first conductive material to a second location, wherein the conductive member does not overlie the elevated surface.

25. The assembly of claim 24 wherein the second conductive material is different from the first conductive material.

26. An assembly formed on a semiconductor substrate, comprising:

a base surface over the substrate and an adjacent elevated surface over the substrate, the elevated surface being spaced from the base surface by a first distance thereby defining a step having a step wall, the step wall having a first portion proximate the base surface and a second portion relatively removed from the base surface;

a layer of a first conductive material over the elevated surface and the second portion of the step wall but not over the first portion of the step wall; and an electrical interconnect of a second conductive material provided between the first conductive material layer and a second location, wherein the electrical interconnect does not overlie the elevated surface.

27. The assembly of claim 26 wherein the second conductive material is different from the first conductive material.

28. An assembly formed on a semiconductor substrate, comprising:

a base surface over the substrate and an adjacent step wall, the step wall having a first portion proximate the base surface and a second portion relatively removed from the base surface;

a layer of a first conductive material over the second portion of the step wall but not over the first portion of the step wall; and an electrical interconnect of a second conductive material provided between the first conductive material layer and a second location, wherein the electrical interconnect does not overlie the second portion of the step wall.

29. The assembly of claim 28 wherein the second conductive material is different from the first conductive material.

30. An assembly formed on a semiconductor substrate, comprising:

a semiconductive material pillar generally projecting away from the substrate, the pillar having a top surface and having at least one side surface extending to the substrate;

a layer of a first electrically conductive material over and against the top surface, the first conductive material layer over and against the top surface not extending to the substrate proximate the pillar; and a conductive member formed of a second electrically conductive material electrically coupling the first conductive material to a second location, the second electrically conductive material physically contacting the first electrically conductive material.

31. An assembly formed on a semiconductor substrate, comprising:
   a semiconductive material pillar generally projecting away from the substrate, the pillar having an outer surface, the outer surface having a first portion proximate the substrate and a second portion relatively removed from the substrate;
   a layer of a first conductive material over and against the second portion of the pillar but not over the first portion of the pillar; and
   an electrical interconnect of a second conductive material provided between the first conductive material layer and a second location, the second conductive material physically contacting the first conductive material.

* * * * *

UNITED STATES PATENT AND TRADEMARK OFFICE
CERTIFICATE OF CORRECTION

PATENT NO.  : 5,869,787

DATED       : February 9, 1999

INVENTOR(S) : Salman Akram

It is certified that error appears in the above-identified patent and that said Letters Patent are hereby corrected as shown below:

Col. 4, l. 41:   Replace "closure." with --disclosure.--

Signed and Sealed this

Twenty-fourth Day of August, 1999

Attest:

Q. TODD DICKINSON

Attesting Officer     Acting Commissioner of Patents and Trademarks